US007167367B2

(12) United States Patent
Zhang

(10) Patent No.: US 7,167,367 B2
(45) Date of Patent: Jan. 23, 2007

(54) HEAT SINK CLIP

(75) Inventor: Jie Zhang, Dongguan (CN)

(73) Assignee: Molex Incorporated, Lisle, IL (US)

( * ) Notice: Subject to any disclaimer, the term of this patent is extended or adjusted under 35 U.S.C. 154(b) by 270 days.

(21) Appl. No.: 10/947,887

(22) Filed: Sep. 23, 2004

(65) Prior Publication Data

US 2005/0066487 A1    Mar. 31, 2005

(30) Foreign Application Priority Data

Sep. 26, 2003   (CN)   ................................ 092217333

(51) Int. Cl.
*H05K 7/20*   (2006.01)

(52) U.S. Cl. ...................... 361/704; 361/703; 361/719; 24/458; 248/510; 257/719

(58) Field of Classification Search ...................... None
See application file for complete search history.

(56) References Cited

U.S. PATENT DOCUMENTS 5,638,258 A * 6/1997 Lin ............................. 361/704
6,318,452 B1 * 11/2001 Lee ............................ 165/80.3
6,452,801 B1 * 9/2002 Chen ........................... 361/704
6,542,367 B1 * 4/2003 Shia et al. ................... 361/703
6,731,504 B1 * 5/2004 Liu ............................. 361/704
7,013,537 B1 * 3/2006 Lin et al. ...................... 24/457
7,061,764 B1 * 6/2006 Lai et al. ..................... 361/704

* cited by examiner

*Primary Examiner*—Boris Chervinsky
(74) *Attorney, Agent, or Firm*—Robert J. Zeitler

(57) ABSTRACT

A heat sink clip has a first housing, a second housing, a sliding bolt and an actuation member. The first housing has a leg and a pressing part extends from the first housing. The second housing has ear-like pieces, and sliding grooves are located in the ear-like pieces. The sliding bolt is fixed on the leg of the first housing, and the sliding bolt slides up and down on the sliding grooves of the second housing. The actuation member includes a wrenching part which is connected to a pivotally connecting part and the pivotally connecting part is further connected to the ear-like pieces of the second housing. The sliding bolt is in contact with the actuation member. Further, the heat sink clip is latched by actuating the actuation member to contact the sliding bolt, therefore, the leg of the first housing is moved downward.

8 Claims, 5 Drawing Sheets

HEAT SINK CLIP

FIELD OF THE INVENTION

The present invention is related to a heat sink clip, and especially to a heat sink clip having a housing piece that allows for adjustment.

BACKGROUND OF THE INVENTION

With the development of the computer industry, the size of the chip sets used in computers is getting smaller, but the heat generated by a chip set is increasing. In order to dissipate the dense heat from the system and keep the chip set working at a normal temperature, a thermal conducting plate is set upon the chip set and connected to a heat sink module for prolonging the life of the chip set.

The above-mentioned chip set is set on the circuit board and the thermal conducting plate is set on the top of the chip set. In addition, a heat sink clip is needed for clipping a thermal conducting plate to a chip set of the circuit board tightly, and the heat generated by the chip set will be passed to the thermal conducting plate and the heat sink module.

Nevertheless, operating with prior art heat sink clips is laborious and inconvenient because the heat sink clips must be pressed tightly to clip the thermal conducting plate tightly and no gap is reserved for latching the heat sink clips.

SUMMARY OF THE INVENTION

The present invention provides a heat sink clip, in which a gap between the heat sink and a thermal conducting plate is reserved by fine tuning and heat sink assembly is easier. The gap is also eliminated for latching the heat sink tightly on the thermal conducting plate and the thermal conducting plate will retain on the chip set. Therefore, heat generated by the chip set is passed to the thermal conducting plate for an effective heat dissipation rate.

To achieve the above-mentioned object, the present invention provides a heat sink clip, which comprises a first housing with a leg and a pressing piece extending from the first housing, a second housing with ear-like pieces and sliding grooves set on the ear-like groove, a sliding bolt fixed on the leg of the first housing, the sliding bolt sliding up and down on the sliding grooves of the second housing, and an actuation member. The actuation member includes a wrenching part connected to a pivotally connecting part and the pivotally connecting part is connected to the ear-like pieces of the second housing. The sliding bolt is in contact with the actuation member. Therefore, the leg of the first housing is moved downward by actuating the actuation member to contact the sliding bolt for latching the apparatus.

To provide a further understanding of the invention, the following detailed description illustrates embodiments and examples of the invention, this detailed description being provided only for illustration of the invention.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE DISCLOSED EMBODIMENTS

Figure 1:
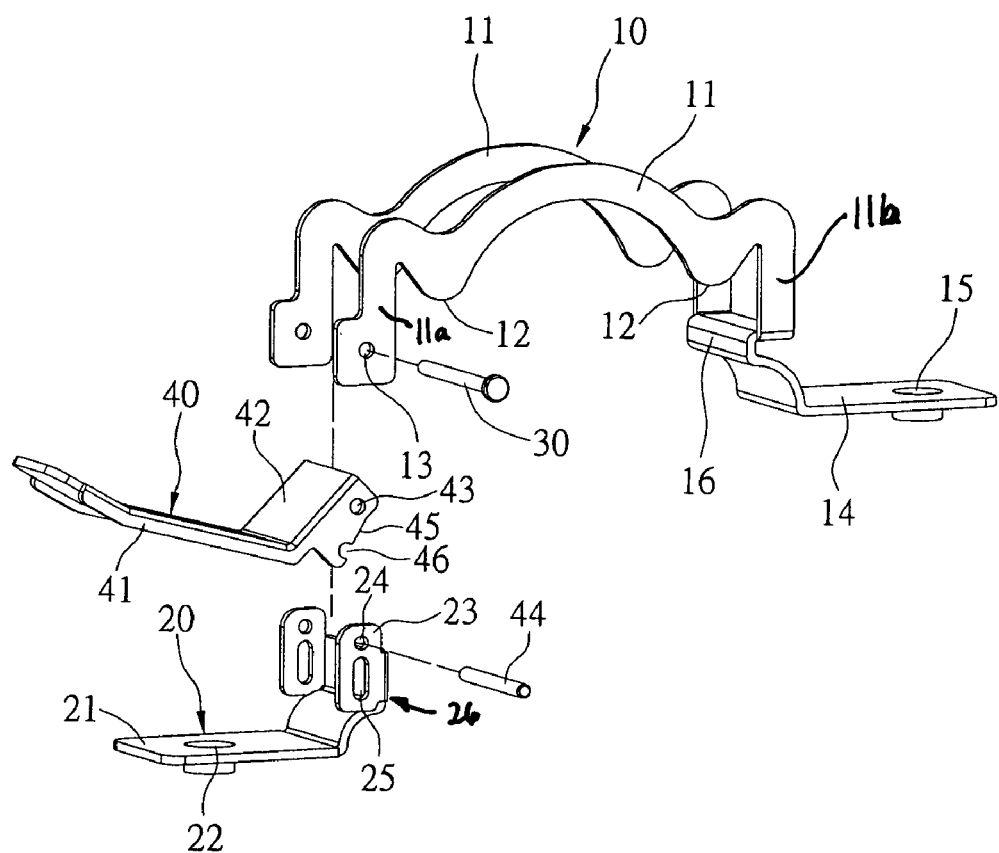
FIG. 1 shows an exploded view of a heat sink clip of the present invention.
Figure 2:
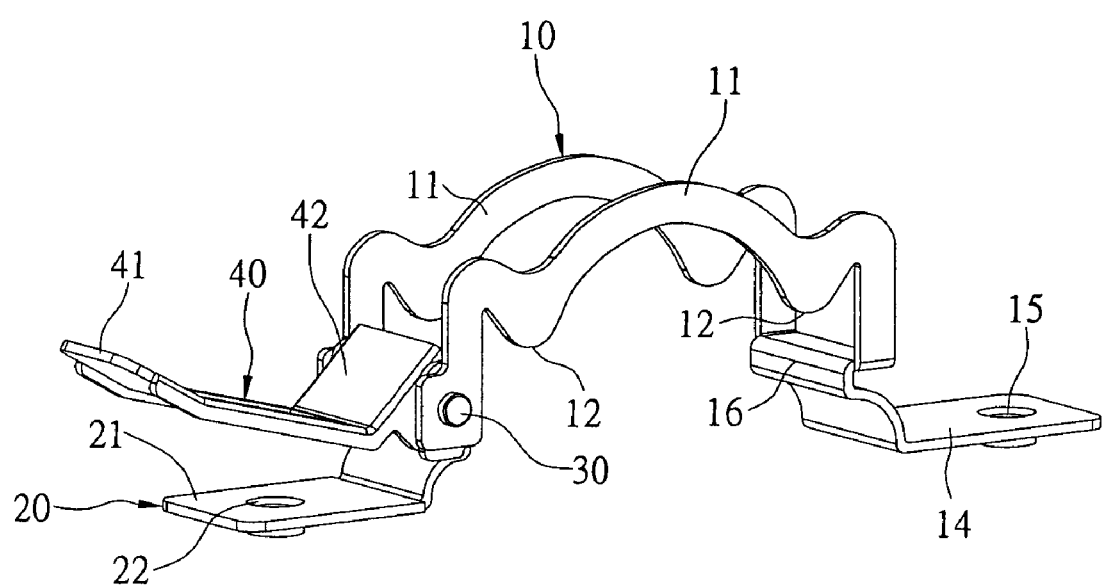
FIG. 2 shows a perspective view of the present invention.
Figure 3:
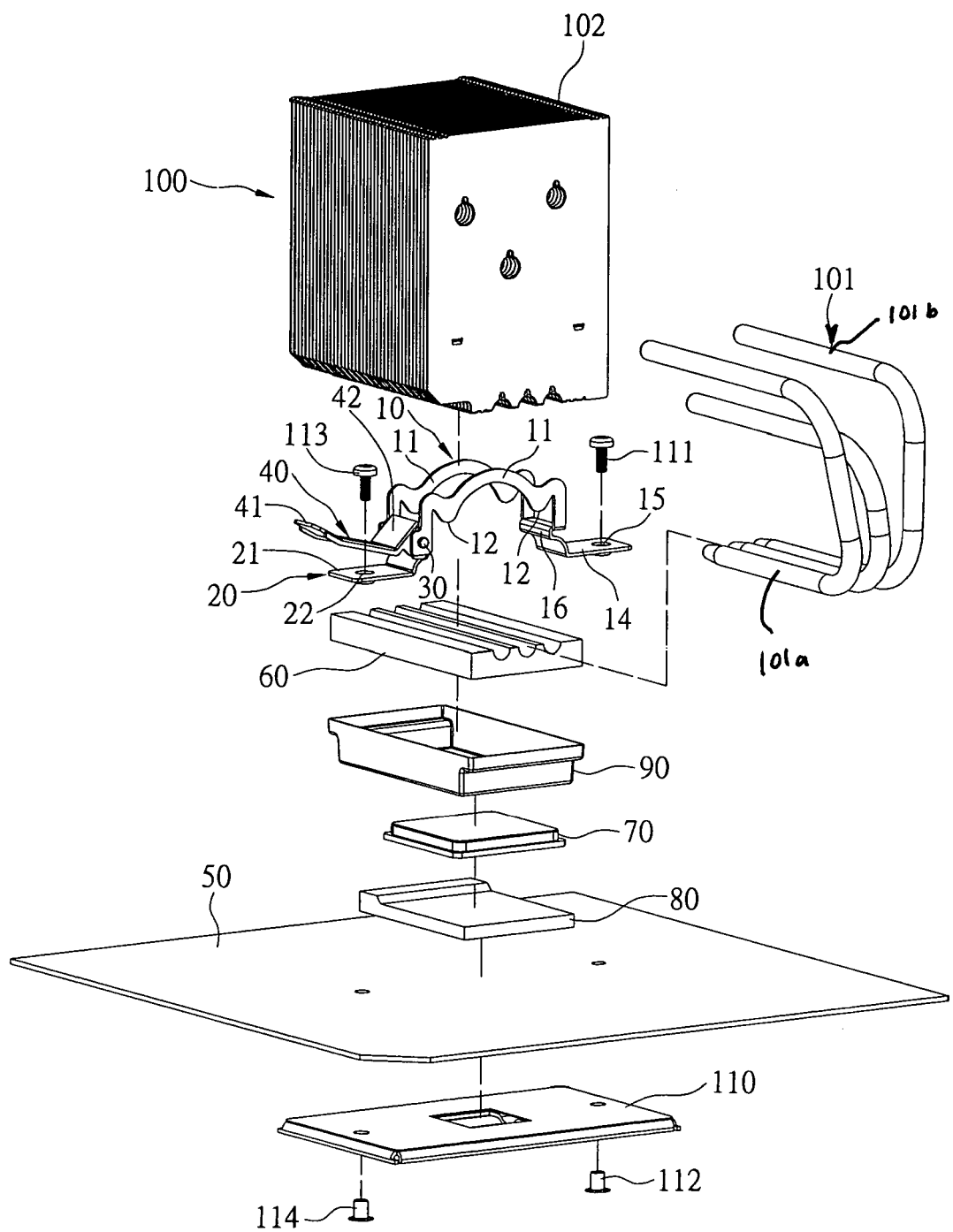
FIG. 3 shows an exploded view of a thermal conducting plate, a chip set and heat sink module of the present invention.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Reference is made to FIGS. 1–4. The present invention provides a heat sink clip that can be set on a circuit board 50 (FIGS. 3 and 4) to clip a thermal conducting plate 60 to a chip set 70 tightly, in which the chip set 70 is set in a socket 80 in the circuit board 50 and the thermal conducting plate 60 is set on the top surface of the chip set 70. Additionally, a spacing frame 90 circumscribes the chip set 70 and the thermal conducting plate 60 for fixing the position of the chip set 70 and the thermal conducting plate 60. A heat sink module 100 is connected to the thermal conducting plate 60; therefore, the heat generated by the chip set 70 can be transferred to the thermal conducting plate 60 and the heat sink module 100.

The heat sink module 100 is composed of a plurality of thermal conducting tubes 101 and thermal conducting fin-like pieces 102. One portion 101a of the thermal conducting tube 101 is connected to the thermal conducting plate 60, and the other portion 102b is connected to the thermal conducting fin-like piece 102. Hence, the heat generated by the chip set 70 is transferred to the thermal conducting tubes 101 and the thermal conducting fin-like pieces 102 through the thermal conducting plate 60 for taking heat away from the chip set 70.

The heat sink clip comprises a first housing 10, a second housing 20, a sliding bolt 30 and an actuation member 40 (FIGS. 1 and 2), in which the first housing includes a two-piece body 11, and two pressing pieces 12 extend from the two-piece body 11 for interfacing with a top surface of the thermal conducting plate 60. Furthermore, one leg 11a of the two-piece body 111 stretches downward, and corresponding bolt holes are set in the leg 11a. The other leg 11b also stretches downward and a fixing part 14 is connected to the leg 11b; the fixing part 14 can be put on the circuit board 50, and a fixing hole 15 is located in the fixing part 14 to receive a screw 111. Therefore, the first housing 10 can be fixed on the circuit board 50 by using a back panel 110, screws 111 and nuts 112. Otherwise, the leg 11a of the first housing 10 with a bolt hole 13 is a free leg 11a, and it can be swung up and down lightly. A curved part 16 is formed between the fixing part 14 and the two-piece body 11, and with the elasticity of the curved part 16, the heat sink clip can be released by swinging up the leg 11a of the first housing 10.

The second housing 20 includes a fixing part 21, and the fixing part 21 can be set on the circuit board 50. A fixing hole 22 is located in the fixing part 21 for receiving a screw 113.

Therefore, the second housing 20 can be fixed on the circuit board 50 by using a back panel 110, the screws 113 and nuts 114. Further, a leg 26 of the second housing 20 is stretched upward to form two ear-like pieces 23, and pivotal hole 24 and a sliding groove 25 are located in the ear-like pieces 23, respectively. The sliding groove 25 is set under the pivotal hole 24, and the sliding groove 25 is stretched vertically for a specified length.

Furthermore, the sliding bolt 30 pierces through two bolt holes 13 of the leg 11a of the first housing 10 and the sliding groove 25 on the ear-like pieces 23 of the second housing 20. Hence, the sliding bolt 30 can be fixed on the leg 11a of the first housing 10. The sliding bolt 30 also slides on the sliding groove 25 of the second housing 20 to allow the leg 11a of the first housing 10 to swing up and down. The actuation member 40 includes a wrenching part 41, and a pivotally connecting part 42 is connected to the wrenching part 41. Further, corresponding pivotal holes 43 are set at both sides of the pivotally connecting part 42 and a pivotal axis 44 pierces through pivotal holes 24 on the two ear-like pieces 23 of the second housing 20 and the pivotal holes 43 on both sides of the pivotally connecting part 42 of the actuation member 40. Therefore, the pivotally connecting part 42 can be pivotally connected to the ear-like pieces 23 of the second housing 20. The wrenching part 41 of the actuation member 40 can be actuated up and down by viewing the pivotal axis 44 as an axle center and the actuation member 40 can also be actuated up and down. A conducting part 45 and an orientation groove 46 is formed under the actuation member 40 and the pivotally connecting part 42. The sliding bolt 30 is interfaced with the conducting part 45 and the actuation member 40 can be actuated to bring the conducting part 45 into contact with the sliding bolt 30; then, the sliding bolt 30 is thus moved down.

Figure 4:
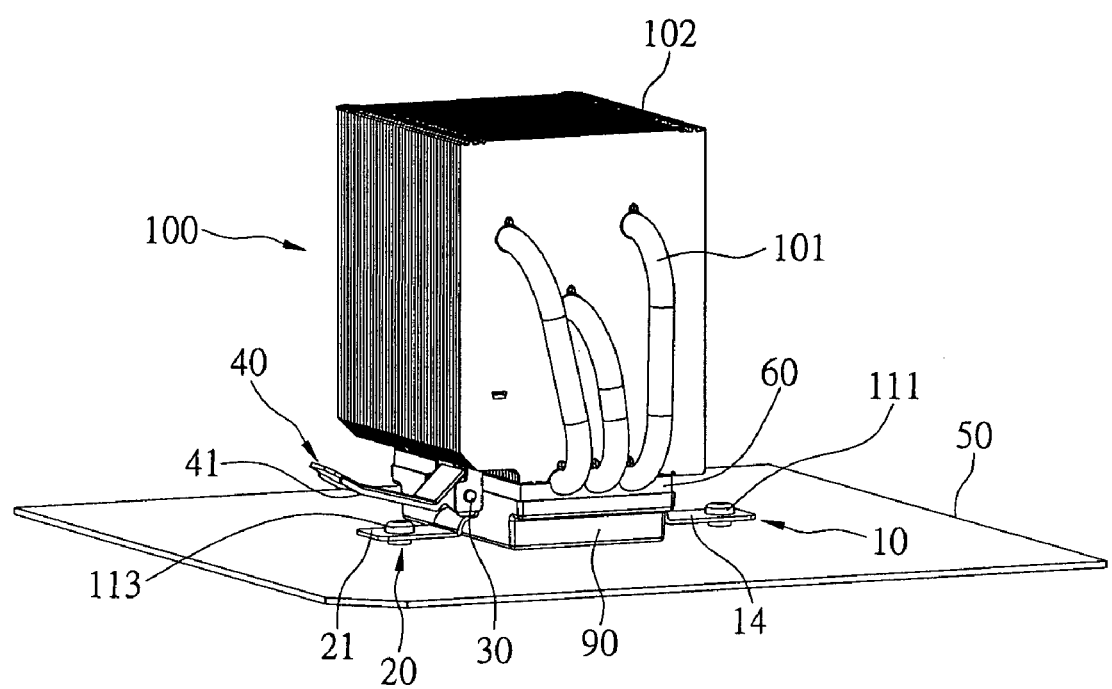
FIG. 4 shows a perspective view of the latching status of the heat sink clip.
Figure 5:
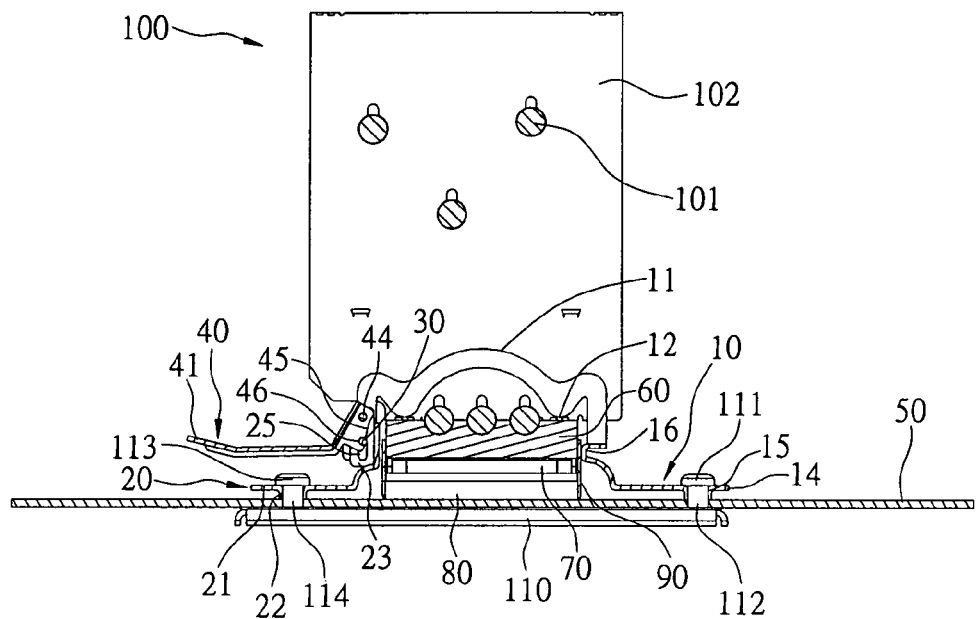
FIG. 5 shows a cross-sectional view of the latching status of the heat sink clip.

When the heat sink is fixed on the circuit board 50, the first housing is set upon the thermal conducting plate 60 and the actuation member 40 can be actuated up and down. The actuation member 40 is actuated down to make the conducting part 45 contact with the sliding bolt 30, and then the sliding bolt 30 is thus moved along the conducting part 45 to the orientation groove 46 (FIGS. 4 and 5). Meanwhile, the pressing piece 12 of the first housing 10 is interfaced with the top surface of the thermal conducting plate 60 and the heat sink clip is latched. The first housing is thus pressed on the thermal conducting plate 60 to clip the thermal conducting plate 60 to the chip set 70 tightly, and the heat generated by the chip set 70 can be transferred to the thermal conducting plate 60 and the heat sink module 100.

Figure 6:
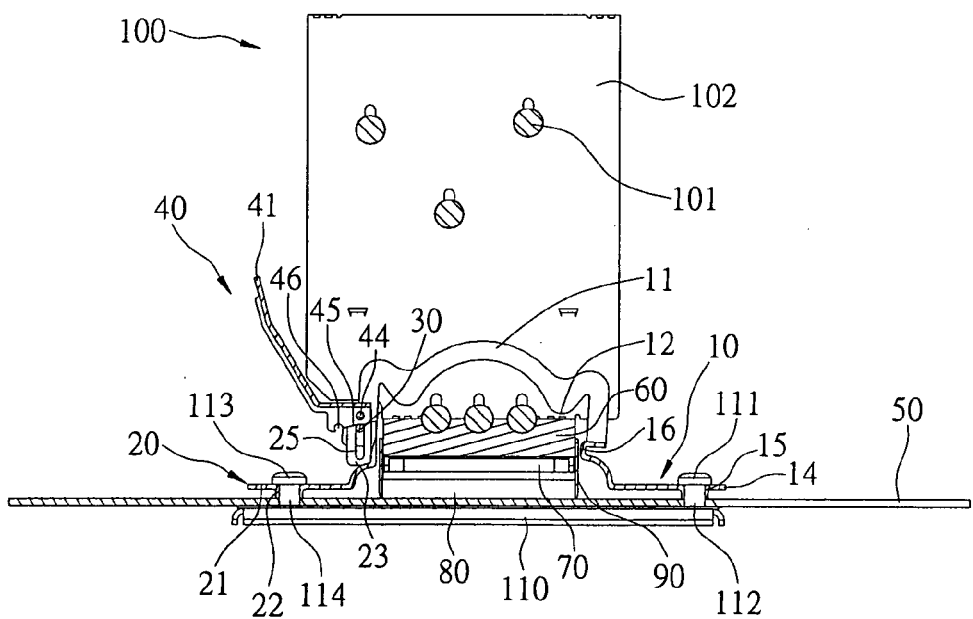
FIG. 6 shows a cross-sectional view of the releasing status of the heat sink clip.

When the actuation member 40 is actuated up, the sliding bolt is released from the orientation groove 46 and moved upward (FIG. 6). At this time, the force between the pressing piece 12 and the top surface of the thermal conducting plate 60 is also released; therefore, the leg 11a of the first housing 10 is swung up by the elasticity provided by the curved part 16 and the heat sink clip is released.

The present invention allows the heat sink clip to be latched and released by actuating the actuation member 40 and preserves a gap between the thermal conducting plate and the heat sink clip by fine tuning. Further, the gap can also be eliminated to fix the heat sink clip tightly on the thermal conducting plate, and then the thermal conducting plate can be pasted to the chip set for effectively scattering the heat generated by the chip set.

While a preferred embodiment of the present invention is shown and described, it is envisioned that those skilled in the art may devise various modifications of the present invention without departing from the spirit and scope of the appended claims.

What is claimed is:

1. A heat sink clip, comprising:
   a first housing with a leg extending from the first housing;
   a second housing with ear-like pieces, and sliding grooves set on the ear-like pieces;
   a sliding bolt set fixed on the leg of the first housing, wherein the sliding bolt slides up and down on the sliding grooves of the second housing; and
   an actuation member pivotally connected to the ear-like pieces of the second housing;
   wherein when the heat sink clip is latched by actuating the actuation member, the leg of the first housing moves downward.

2. The heat sink clip as in claim 1, wherein the first housing includes a two-piece body and the pressing piece extends from the two-piece body.

3. The heat sink clip as in claim 1, wherein the first housing and the second housing include respective fixing parts, and fixed holes are located in the fixing parts for fixing on a circuit board.

4. The heat sink clip as in claim 1, wherein a curved part is set on the first housing for moving the leg of the first housing upward and flexibly.

5. The heat sink clip as in claim 1, wherein pivot holes are located in the ear-like pieces of the second housing and a pivotal part of the actuation member, and an axle extends through the pivot holes of the ear-like pieces and the pivotal part for connecting the actuation member with the second housing.

6. The heat sink clip as in claim 1, wherein a guiding part and an orientation groove are located in the pivotal part of the actuation member, and the sliding bolt interacts with the guiding part and is fixed in the orientation groove.

7. The heat sink clip as in claim 1, wherein the heat sink clip is set on a circuit board for clipping a chip set with a thermal conducting plate, the chip set is plugged into a socket in the circuit board, and a heat sink module is connected to the thermal conducting plate.

8. The heat sink clip as in claim 1, wherein a pressing piece extends from the first housing in a direction of the leg.

* * * * *